(12) United States Patent
Lewis

(10) Patent No.: US 8,866,527 B1
(45) Date of Patent: Oct. 21, 2014

(54) INTEGRATED CIRCUITS WITH HOLD TIME AVOIDANCE CIRCUITRY

(75) Inventor: David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 690 days.

(21) Appl. No.: 12/753,834

(22) Filed: Apr. 2, 2010

(51) Int. Cl.
*H03K 3/289* (2006.01)
*H03K 3/012* (2006.01)

(52) U.S. Cl.
CPC .................................. *H03K 3/012* (2013.01)
USPC ...................................................... 327/202

(58) Field of Classification Search
USPC .................. 327/199–203, 208, 210–215, 218
See application file for complete search history.

(56) References Cited

U.S. PATENT DOCUMENTS

| | | | |
|---|---|---|---|
| 5,175,447 A | 12/1992 | Kawasaki et al. | |
| 5,375,083 A | 12/1994 | Yamaguchi | |
| 5,490,151 A | 2/1996 | Feger et al. | |
| 5,633,606 A | 5/1997 | Gaudet et al. | |
| 5,668,490 A * | 9/1997 | Mitra et al. | 327/203 |
| 5,801,411 A | 9/1998 | Klughart | |
| 5,881,067 A | 3/1999 | Narayanan et al. | |
| 5,883,423 A | 3/1999 | Patwa et al. | |
| 5,886,901 A | 3/1999 | Magoshi | |
| 5,898,330 A | 4/1999 | Klass | |
| H001796 H | 7/1999 | Srivatsa et al. | |
| H1796 H | 7/1999 | Srivatsa et al. | |
| 5,920,575 A * | 7/1999 | Gregor et al. | 714/726 |
| 5,946,259 A | 8/1999 | Manning et al. | |
| 5,998,846 A | 12/1999 | Jan et al. | |
| 6,303,957 B1 | 10/2001 | Ohwa | |
| 6,452,433 B1 * | 9/2002 | Chang et al. | 327/202 |
| 6,509,622 B1 | 1/2003 | Ma et al. | |
| 7,009,228 B1 | 3/2006 | Yu | |
| 7,247,543 B2 | 7/2007 | Shih et al. | |
| 2005/0189602 A1 | 9/2005 | Yamamoto et al. | |
| 2006/0267132 A1 | 11/2006 | Lee | |
| 2007/0162802 A1 * | 7/2007 | Miwa | 714/726 |
| 2007/0162803 A1 * | 7/2007 | Dervisoglu et al. | 714/726 |
| 2007/0226560 A1 * | 9/2007 | Uchida | 714/724 |

OTHER PUBLICATIONS

Tan, Chee Hong. U.S. Appl. No. 12/717,796, filed on Mar. 4, 2010.
Ang, Chin Hai. U.S. Appl. No. 12/356,495, filed on Jan. 20, 2009.

* cited by examiner

*Primary Examiner* — Sibin Chen
(74) *Attorney, Agent, or Firm* — Treyz Law Group; Jason Tsai

(57) ABSTRACT

Integrated circuits with logic circuitry are provided. The logic circuitry may be organized into logic regions. Each logic region may include a multiplexer, a flip-flop, a logic circuit, etc. The flip-flop may have an input that is connected to an output of the multiplexer. The multiplexer may have a first input connected to an output of the flip-flop in an adjacent logic region. The multiplexer may have a second input connected to the logic circuit. The logic regions may be connected in a chain. The flip-flops may be controlled by first and second control signals. The second control signal may be a delayed version of the first control signal. The multiplexer may be controlled by the second control signal. The flip-flops may include master and slave latches. The master latch is controlled by the first control signal while the slave latch is controlled by the first and second control signals.

14 Claims, 6 Drawing Sheets

INTEGRATED CIRCUITS WITH HOLD TIME AVOIDANCE CIRCUITRY

BACKGROUND

This relates generally to integrated circuits, and more particularly, to integrated circuits with flip-flops.

Integrated circuits often include circuits such as scan chain circuits. A typical scan chain includes flip-flops that are connected in a chain. A scan chain having a series of flip-flops connected in this way may sometimes be referred to as a shift register.

The flip-flops are controlled by a clock signal. Each flip-flop has a master latch and a slave latch. The master latch is enabled during a low clock phase of the clock signal (i.e., when the clock signal is pulsed low) while the slave latch is enabled during a high clock phase of the given clock signal (i.e., when the clock signal is pulsed high).

A pair of consecutive flip-flops in the scan chain may receive clock signals that are skewed with respect to each other. For example, consider a scenario in which a first flip-flop in the pair of flip-flops receives a given clock signal, and a second flip-flop in the pair of flip-flops receives a clock signal that is skewed from the given clock signal. In this example, the (skewed) clock signal that is received by the second flip-flop may exhibit a delayed rising clock edge relative to the rising clock edge of the given clock signal.

A problem arises when the output of the first flip-flop changes value before the rising clock edge of the skewed clock signal. This will cause the second flip-flop to latch an incorrect value during scan operations. Circuit malfunctions of this type are sometimes referred to as hold time violations.

It would be desirable to be able to provide improved flip-flops such as flip flips that avoid hold time violations.

SUMMARY

Integrated circuits may include logic circuitry. The logic circuitry may include sequential and combinational logic. The logic circuitry may be organized into logic blocks. The logic blocks may be arranged in multiple logic regions.

Each logic region may include a multiplexer, a flip-flop, a logic circuit, and other circuitry (e.g., programmable circuitry such as lookup table circuits). The flip-flop may have an input that is connected to an output of the multiplexer and may have an output. The multiplexer in a given logic region may have a first input that is connected to the output of the flip-flop of an adjacent logic region and a second input that is connected to logic circuitry in the given logic region.

The circuitry of the logic regions may be connected in series to form a scan chain. Each flip-flop may have first and second control inputs that are controlled by first and second control clock signals, respectively. The second control clock signal may be a delayed version of the first clock signal. For example, the second control clock may be delayed by a quarter clock cycle relative to the first control clock signal. Each multiplexer may have a control input that is controlled by the second control clock signal.

The first and second control signals may be generated by control circuitry. The control circuitry may include an oscillator that feeds a reference clock signal to a phase-locked loop. The phase-locked loop may be used to produce the first and second control signals with a clock rate that is an integer multiple of the clock rate of the reference clock signal. The control circuitry may output the second control signal as a dynamic clock signal to place the logic regions in a scan mode. The control circuitry may output the second control signal as a static signal (e.g., a signal fixed at "1") to place the logic regions in a normal operational mode.

The flip-flop may include a master latch and a slave latch that are connected in series. The master latch may be enabled (e.g., placed in a "transparent" state in which the value stored at the output is allowed to change) when the first control signal is low. The slave latch may be enabled when the first and second control signals are high. A scan chain formed using flip-flops that are controlled by multiple control signals may be used to avoid potential hold time violations.

Further features of the present invention, its nature and various advantages will be more apparent from the accompanying drawings and the following detailed description.

DETAILED DESCRIPTION

This relates to integrated circuits with scan chain circuitry. The scan chain circuitry may be used on any suitable type of integrated circuit such as digital signal processors, microprocessors, application-specific integrated circuits, programmable circuits, etc.

Figure 1:
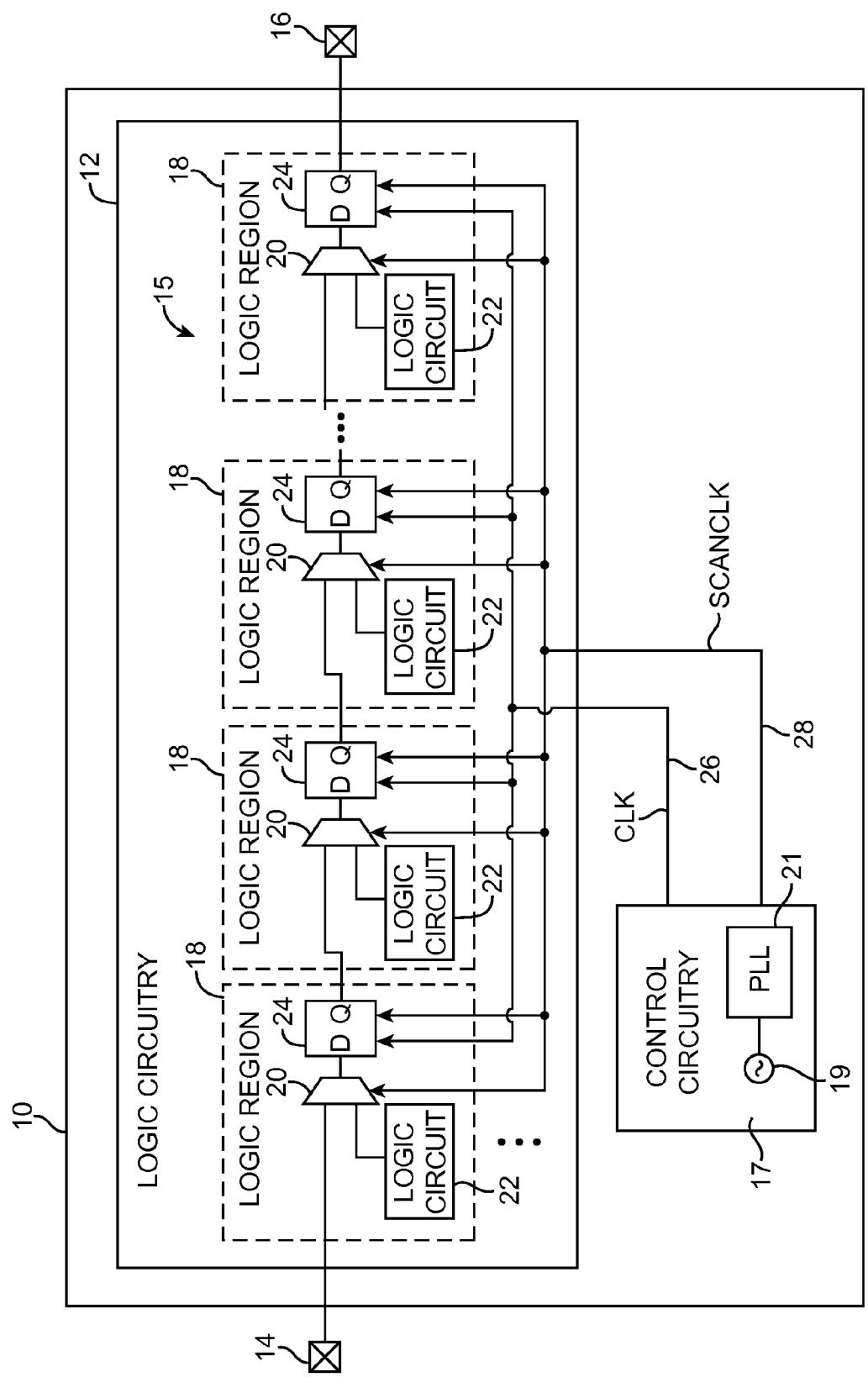
FIG. 1 is a circuit diagram of an illustrative integrated circuit with scan chain circuitry in accordance with an embodiment of the present invention.

An illustrative integrated circuit that may be provided with scan chain circuitry is shown in FIG. 1. Integrated circuit 10 may have circuitry 12 (sometimes referred to as "logic"). Circuitry 12 may include combinational and sequential logic circuitry. Device 10 may include logic circuitry 12, interconnection resources, input-output circuitry, and other circuitry. Device 10 may for example, be a programmable integrated circuit such as a programmable logic integrated circuit.

The circuitry of device 10 may be organized using any suitable architecture. As an example, logic circuitry 12 of device 10 may be organized in a series of rows and columns of logic regions 18, as shown in FIG. 1. Logic regions 18 may be interconnected by interconnection resources such as associated vertical and horizontal conductors. These conductors may include global conductive lines that span substantially all of device 10, fractional lines such as half-lines or quarter lines that span part of device 10, staggered lines of a particular length (e.g., lines with lengths sufficient to interconnect several logic areas), smaller local lines that interconnect logic regions 18 with other logic regions 18 in a given area, or any other suitable interconnection resource arrangement.

If desired, the logic of device 10 may be arranged in more levels or layers in which multiple regions 18 are interconnected to form still larger portions of logic (sometimes referred to as logic array blocks or LABs). Still other device arrangements may use logic that is not arranged in rows and columns. In some logic devices 10, the logic regions 18 may be referred to as logic elements (LEs) or adaptive logic modules (ALES).

Each logic region 18 may include a logic circuit such as logic circuit 22, a multiplexer such as multiplexer 20, a flip-flop such as flip-flop 24, look-up table logic, and memory elements (i.e., configuration random access memory cells). Logic circuit 22 may be a combinational logic circuit that provides normal operational data (as an example). Flip-flop 24 may sometimes be referred to as a register. If desired, each logic region 18 may include more than one multiplexer and more than one register.

Flip-flops 24 and multiplexers 20 in logic regions 18 may be used to form scan chains. As shown in FIG. 1, the circuits in each logic region 18 can be connected to form a scan chain such as scan chain 15. Each flip-flop 24 that is part of scan chain 15 may have an input (D) that is connected to an output of an associated multiplexer 20 within the same logic region 18. Each flip-flop 24 may have an output (Q). Each flip-flop 24 may have control inputs that receive control signals such as an original clock signal CLK (i.e., a master clock) and a scan clock signal SCANCLK. Clock signals CLK and SCANCLK may be square wave clock signals having 50% duty cycles. Circuitry 17 may be configured so that CLK and SCANCLK have other suitable duty cycles, if desired.

Each multiplexer 20 that is part of scan chain 15 may have a first input that is connected to the output of flip-flop 24 in a previous logic region 18 (e.g., an adjacent logic region that provides multiplexer 18 with new data). Each multiplexer 20 may also have a second input that is connected to a logic circuit 22 within the same logic region. Each multiplexer 20 may have a control input that is controlled by scan clock signal SCANCLK. In general, when the control inputs of multiplexers 20 are low, scan chain 15 operates in a scan mode (e.g., a mode for testing device 10). When the control inputs of multiplexers 18 are high, logic regions 18 may be placed in a normal operational mode.

Scan chain 15 may have a first logic region 18 that includes circuits forming a first stage of the scan chain. Multiplexer 20 in the first logic region may have a first input that is driven by an external input-output pin such as pin 14. Pin 14 may provide data for scanning into scan chain 15. Scan chain 15 may have a last logic region 18 that includes circuits forming a last stage of the scan chain. Flip-flop 24 in the last logic region may have an output that is connected to another external input-output pin such as pin 16. Pin 16 may receive data that is scanned out from scan chain 15.

The logic circuitry of FIG. 1 is merely illustrative. Logic circuitry 12 may include more than one scan chain, if desired. Each scan chain 15 may be configured to have any number of stages (i.e., any number of logic regions 18 may be connected in a chain), if desired.

Control signals such as clock signals CLK and SCANCLK may be generated over respective lines 26 and 28 by control circuitry such as control circuitry 17, as shown in FIG. 1. Control circuitry 17 may include an oscillator 19 that feeds a reference clock signal to a phase-locked loop 21. Off-chip oscillators may also be used, if desired. Phase-locked loop 21 may be used to generate output clock signals (e.g., CLK and SCANCLK) with a clock rate that is an integer multiple of the clock rate of the reference clock signal.

For example, the reference clock signal may have a given frequency. Line 26 may provide clock signal CLK at a frequency of N times the given frequency. In a typical scenario, the frequency of the reference clock signal might be 200 MHz and the frequency of CLK might be 800 MHz (as an example). Signal SCANCLK on line 28 may also be generated by phase-locked loop 21 in this way.

Phase-locked loop 21 may be used to generate signals CLK and SCANCLK with an approximately equal frequency. Signal SCANCLK may be a phase-shifted version of signal CLK (e.g., SCANCLK may be a time-delayed version of CLK). For example, control circuitry 17 may provide signals CLK and SCANCLK that each have a clock rate of 100 MHz. Signals CLK and SCANCLK may therefore have periods of 10 ns ($1 \div 10^8$). Signal SCANCLK may be time-shifted by 3 ns (e.g., delayed by three-tenths of the clock period) relative to signal CLK (as an example).

Figure 2:
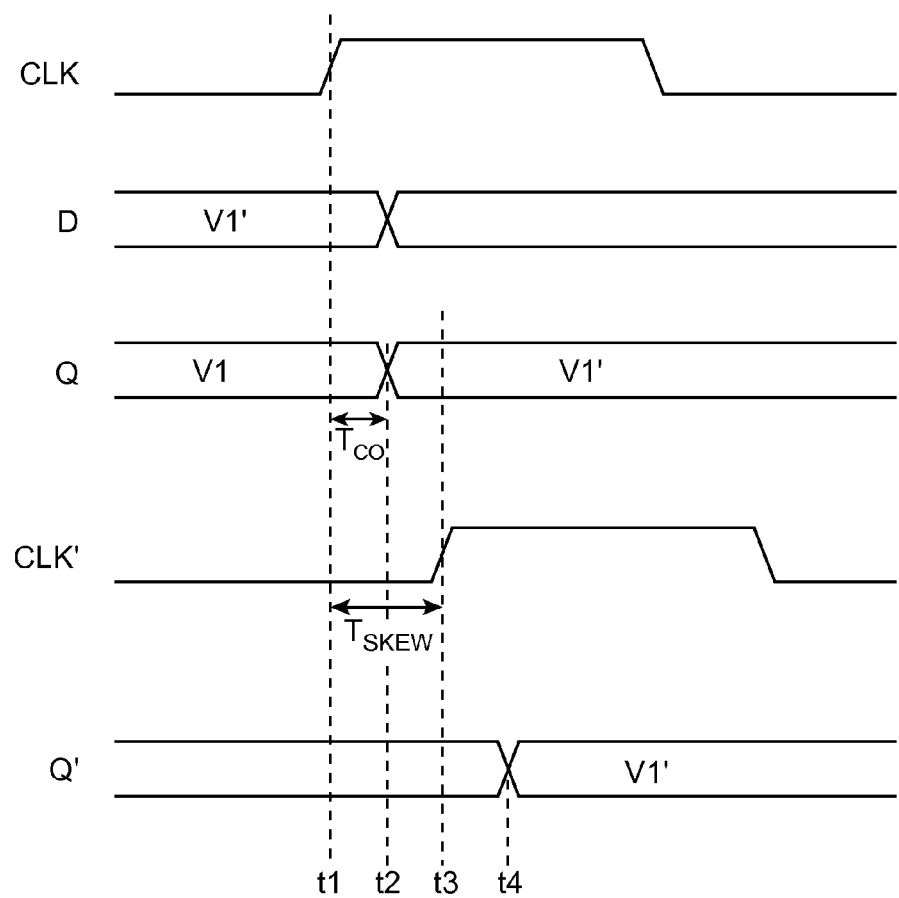
FIG. 2 is a timing diagram illustrating a potential hold time violation.

FIG. 2 is a timing diagram illustrating a potential hold time violation that may arise during operation of multiple flip-flops connected in a chain. Consider a scenario in which a first flip-flop feeds data to a second flip-flop. The first flip-flop has an input D, an output Q, and a control input that is controlled by a clock signal CLK. The second flip-flop may have an input D', an output Q', and a control input that is controlled by a clock signal CLK'. The input D' is connected to output Q of the first flip-flop. Signal CLK' is skewed from clock signal CLK (e.g., signals CLK and CLK' have rising clock edges that are offset from one another, because of interconnect delays). FIG. 2 shows the behavior of relevant signals (e.g., CLK, D, Q, CLK', and Q') during an illustrative clock cycle.

At time t1, signal CLK is raised high. At this time, input D of the first flip-flop is presented with a new data value V1', output Q of the first flip-flop holds an old data value V1, signal CLK' stays low, and output Q' of the second flip-flop holds its old data value.

At time t2, the first flip-flop successfully latches new data value V1' at its output Q. The time period from the rising clock edge of signal CLK to the latching of the new data (e.g., a time period from t1 to t2) may be referred to as a clock-to-output delay $T_{CO}$.

At time t3, signal CLK' is raised high. The delay between the rising edges of signals CLK and CLK' may be a result of skew. The delay between the rising edges of signals CLK and CLK' may therefore be referred to as clock skew delay $T_{SKEW}$. This type of situation may occur when flip-flops are physically close to each other but are electrically far apart. The clock signals that feed the flip-flops in this type of situation may develop skew. For example, two logic array blocks may be adjacent to each other, but may be located in different branches of a clock network.

Input D' of the second flip-flop is coupled to output Q of the first flip-flop. It is desirable for the second flip-flop to latch data value V1 in response to the rising clock at time t3. At time t4, the second flip-flop erroneously latches data value V1' at its output Q', because data value V1' is provided by output Q at the rising clock edge of CLK' (see, e.g., FIG. 2). This scenario in which the second flip-flop latches data improperly may be referred to as a hold time violation (e.g., the clock signal of a receiving flip-flop rises after its input has been changed to a new value).

In general, hold time violations occur when a receiving flip-flop latches data after the output of a previous flip-flop has latched new data (i.e., the receiving flip-flop latches the new data instead of old data). Under proper operation, it is desirable for the receiving flip-flop to latch the old data. One approach to avoid this type of hold time violation may be to delay the time that the previous flip-flop latches new data so that the receiving flip-flop will have more margin (i.e., more time) to capture the old data before the output of the previous flip-flop changes. Multiple control clock signals may be used to provide this type of hold time avoidance.

Figure 3:
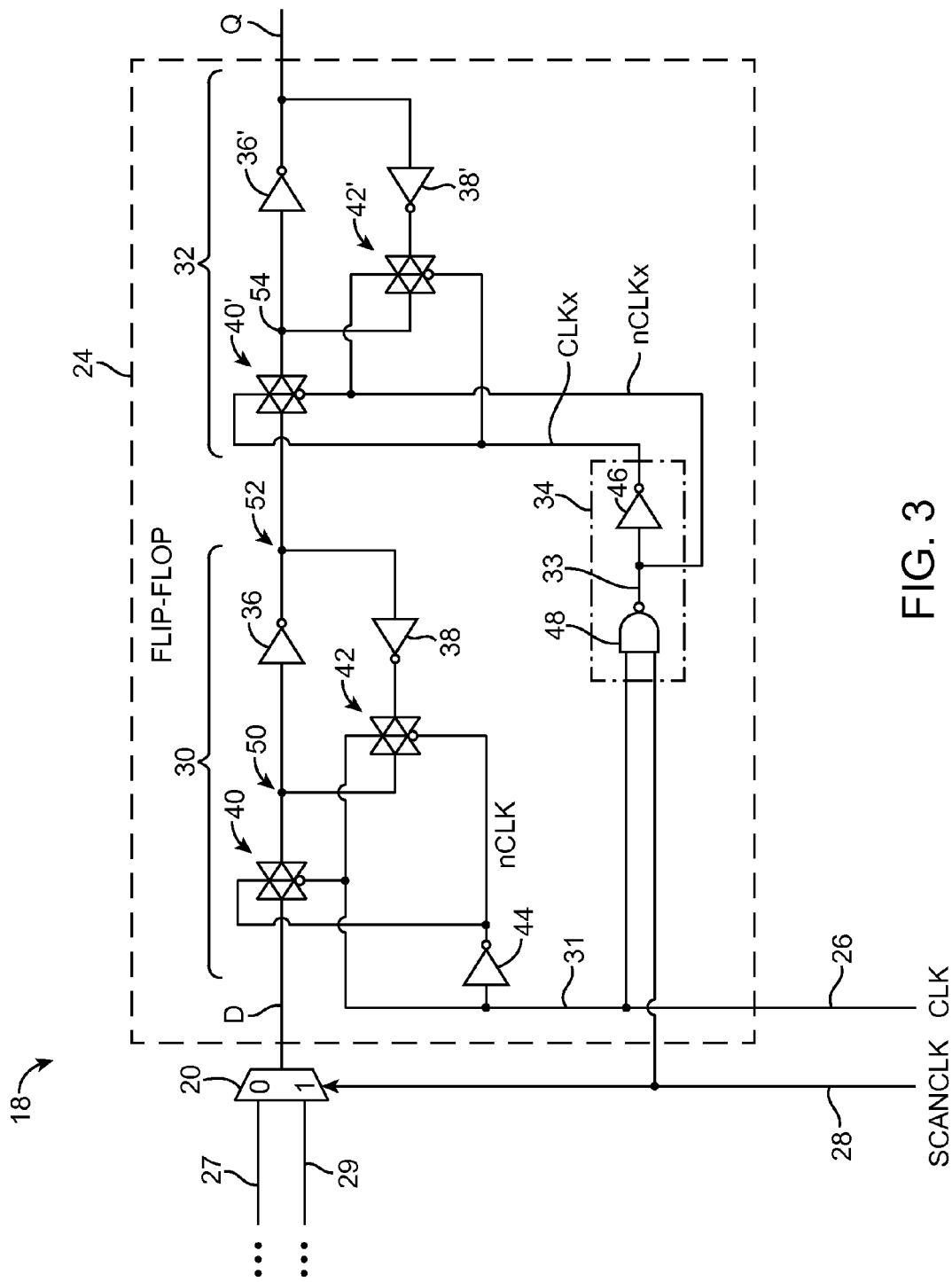
FIG. 3 is circuit diagram of an illustrative flip-flop in accordance with an embodiment of the present invention.

FIG. 3 is a circuit diagram showing the design of a flip-flop that avoids hold time violations. Flip-flop 24 of FIG. 3 may be controlled by multiple clock signals (e.g., CLK and SCAN-CLK) instead of a single clock signal. The use of a secondary clock signal (i.e., SCANCLK) to control flip-flop 24 provides flexibility in adjusting when flip-flop 24 outputs newly latched data (e.g., clock-to-output delay $T_{CO}$ is adjustable) relative to the rising edge of a primary clock signal (i.e., CLK).

Signal SCANCLK may be a delayed versioned of CLK. For example, signals CLK and SCANCLK may each have a clock rate of 10 MHz. Signals CLK and SCANCLK may therefore have a clock period of 100 ns ($1 \div 10^7$). Signal SCANCLK may be time-shifted by 25 ns (e.g., delayed by a quarter of the clock period) relative to signal CLK (as an example). Control circuitry 17 may be configured to provide other amounts of delay (e.g., the delay is adjustable). For example, SCANCLK may be delayed by any amount less than or equal to half the clock period (e.g., SCANCLK may be delayed by ½ clock cycle, ⅓ clock cycle, ¼ clock cycle, ⅙ clock cycle, etc.) relative to CLK.

Flip-flop 24 may include a master latch 30 with a control input 31 and a slave latch 32 with a control input 33. Master latch 30 may include transmission gates 40 and 42 and inverters 36 and 38. Transmission gates 40 and 42 may each be formed from an n-channel transistor and a p-channel transistor connected in parallel. Each transmission gate may have first and second control inputs that are connected to gate terminals of the n-channel transistor and the p-channel transistor, respectively. Each transmission gate may have a first terminal that is connected to drain terminals of the n-channel and p-channel transistors. Each transmission gate may also have a second terminal that is connected to source terminals of the n-channel and p-channel transistors.

Transmission gate 40 may have a first terminal that serves as an input D of flip-flop 24. Gate 40 may have a second terminal that is connected to the input of inverter 36 (at node 50). Gate 40 may have first and second control inputs that are respectively controlled by original clock signal CLK (i.e., a master clock) and an inverted clock signal nCLK (e.g., an inverted version of the master clock signal). Signal CLK may be provided over line 26 while signal nCLK may be generated by inverter 44, which receives CLK at its input.

Inverter 36 may have an output that is connected to the input of inverter 38 (at node 52). The output of inverter 36 may serve as an output for master latch 30. Inverter 38 may have an output that is connected to a first terminal of transmission gate 42. Gate 42 may have a second terminal that is connected to node 50. Gate 42 may have first and second control inputs that are controlled by the original clock signal and the inverted clock signal, respectively.

Slave latch 32 may include transmission gates 40' and 42' and inverters 36' and 38'. Transmission gate 40' may have a first terminal that is connected to the output (node 52) of master latch 30. Gate 40' may have a second terminal that is connected to an input of inverter 36' (at node 54). Gate 40' may have first and second control inputs that are respectively controlled by a signal CLKx (i.e., a slave clock) and a signal nCLKx (i.e., an inverted version of the slave clock).

Signals CLKx and nCLKx may be generated by circuit 34. Circuit 34 may receive signals CLK and SCANCLK over lines 26 and 28. Circuit 34 may include a logic gate such as NAND gate 48 and inverter 46. Circuits 48 and 46 may be connected in series (see, e.g., FIG. 3). Gate 48 may have first and second inputs that receive signals CLK and SCANCLK and an output that provides signal nCLKx. Inverter 46 may have an input that receives signals nCLKx and may have an output that provides signal CLKx. Signal CLKx generated using this approach may be a signal that pulses high when signals CLK and SCANCLK are both high. Signal nCLKx may be an inverted version of signal CLKx (e.g., a signal that pulses low when signals CLK and SCANCLK are both high).

Inverter 36' may have an output that is connected to the input of inverter 38'. The output of inverter 36' may serve as the output of circuit 32 and the output Q for flip-flop 24. Inverter 38' may have an output that is connected to a first terminal of transmission gate 42'. Gate 42' may have a second terminal that is connected to node 54. Gate 42' may have first and second control inputs that are controlled by signals CLKx and nCLKx, respectively.

As described in connection with FIG. 1, the D input of each flip-flop 24 may be connected to the output of an associated multiplexer 20 in each logic region 18, as shown in FIG. 3. The control input of multiplexer 20 may receive signal SCANCLK. A first input 27 of multiplexer 20 may be connected to the output of the flip-flop 24 in a previous logic region 18 (e.g., an adjacent logic region that provides multiplexer 18 with new data). Multiplexer 20 may have a second input 29 that is connected to logic circuit 22 within the same logic region 18 as flip-flop 24 of FIG. 3.

Other types of flip-flops may be used, if desired. For example, flip-flops based on complementary logic gates may be used instead of transmission (pass) gates provided that the latching of the flip-flop is controlled by one clock signal and the transfer of the data to the output is controlled by another clock signal.

Figure 4:
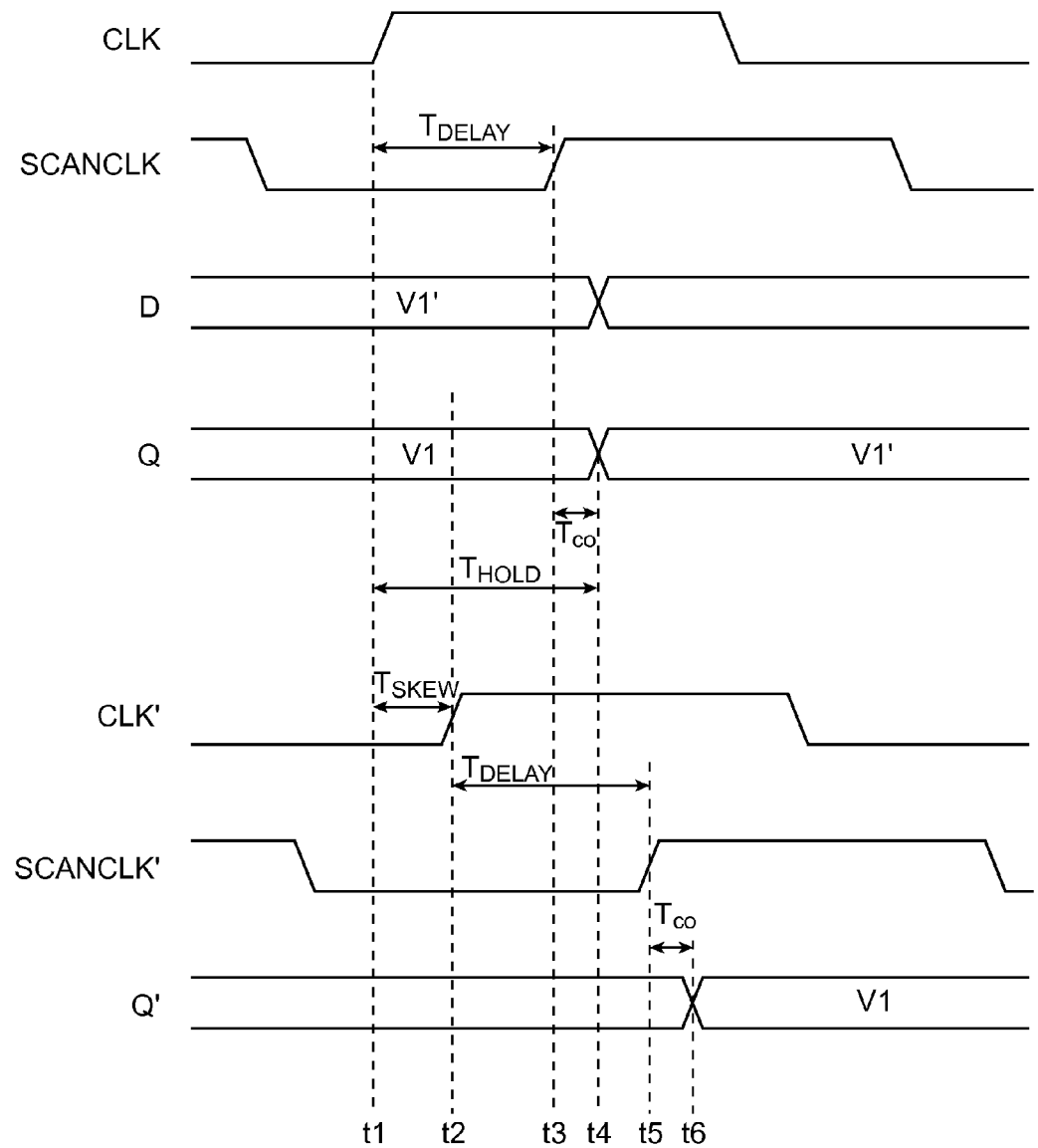
FIG. 4 is a timing diagram illustrating hold time avoidance provided by the flip-flop of FIG. 3 in accordance with an embodiment of the present invention.

FIG. 4 is a timing diagram illustrating proper operation of multiple flip-flops connected in a chain. Consider a scenario in which a given flip-flop 24 of FIG. 3 feeds data to a receiving flip-flop 24. The given flip-flop may have an input D, an output Q, and control inputs that are controlled by clock signals CLK and SCANCLK. The receiving flip-flop may have an input D', an output Q', and control inputs that are controlled by clock signals CLK' and SCANCLK'. Signals CLK' and SCANCLK' may be skewed (time-shifted) from signals CLK and SCANCLK, respectively, because of undesirable delays (e.g., interconnect delays). FIG. 4 shows the behavior of relevant signals (e.g., CLK, SCANCLK, D, Q, CLK', SCANCLK', and Q') during an illustrative clock cycle.

At time t1, signal CLK is raised high. At this time, SCAN-CLK is low, input D of the given flip-flop is presented with a new data value V1', output Q of the given flip-flop holds an old data value V1, signal CLK' is low, signal SCANCLK' is low, and output Q' of the receiving flip-flop holds its old data value.

At time t2, signal CLK' is raised high. The delay between the rising clock edges of signals CLK and CLK' may be a result of clock skew with duration $T_{SKEW}$. At time t3, signal SCANCLK is raised high. The delay between the rising edges of CLK and SCANCLK (which is controlled by control circuitry 17 of FIG. 1) may be a quarter of the clock cycle with duration $T_{DELAY}$ (as an example).

In the time period from t1 to t3, the master latch of the given flip-flop is disabled (e.g., the latch is in an "opaque" state and the value at its input cannot pass to its output) and holds data value V1' (i.e., the data value presented at its input immediately prior to time t1). During this time, the slave latch of the given flip-flop is also disabled (e.g., the output of the slave latch cannot change), because SCANCLK is low.

At time t4, the given flip-flop may successfully latch the new data value V1' at its output Q. When signals CLK and SCANCLK are both high, the master latch of the given flip-flop remains disabled while the slave latch of the given flip-flop is enabled (e.g., the slave latch is placed in a "transparent" state in which the value at its input passes to its output) to latch data that is presented at the output of the master latch of the given flip-flop. The time period from the rise edge of signal SCANCLK to the latching of the new data (e.g., a time period from t3 to t4) may be referred to as a clock-to-output delay $T_{CO}$. The time period between the rising edge of CLK to the latching of the new data at the given flip-flop may be referred to as a hold time $T_{HOLD}$.

At time t5, signal SCANCLK' is raised high. The delay between the rising edges of CLK' and SCANCLK' may be a quarter of the clock cycle with duration $T_{DELAY}$ (as an example). In the time period from t2 to t5, the master latch of the receiving flip-flop is disabled to hold data value V1 (i.e., the data value presented at its input immediately prior to time t2). During this time, the slave latch of the receiving flip-flop is also disabled, because SCANCLK' is low.

Input D' (e.g., the input of the master latch of the receiving flip-flop) may be coupled to output Q of the given flip-flop. It is desirable for the second flip-flop to latch data value V1 in response to the rising clock edge of CLK' at time t2. At time t6, the receiving flip-flop correctly latches data value V1 at its output Q'. This scenario in which the receiving flip-flop latches data as desired avoids a hold time violation by delaying the latching of the given flip-flop to effectively increase hold time during the scan mode. In other words, the clock signal of the receiving flip-flop rises before its input has been changed to a new value (e.g., duration $T_{HOLD}$ is greater than $T_{SKEW}$).

As shown in the circuit diagram of FIGS. 1 and 3, signal SCANCLK controls multiplexers 20. When SCANCLK has a value of "0," logic regions 18 are placed in the scan mode. When SCANCLK has a value of "1," logic regions 18 are placed in the normal operational mode. Control clock signal SCANCLK need not be a static signal. Signal SCANCLK may be a dynamic (clock) signal that toggles between zeros and ones during the scan mode, provided that SCANCLK is low when the master latch of each flip-flop captures new data. This criterion may be satisfied by generating SCANCLK as a delayed version of signal CLK (see, e.g., FIG. 4).

The timing diagram of FIG. 4 illustrates logic circuitry 12 operating in the scan mode. In normal operational mode, signal SCANCLK may be driven high. During normal operation, it may be desirable to minimize the clock-to-output delay to maximize performance. Circuit 34 in flip-flop 24 may introduce a slave latch clock delay that increases the clock-to-output delay (e.g., signal CLK has to propagate through circuit 34 before enabling the slave latch to output new data).

Figure 5:
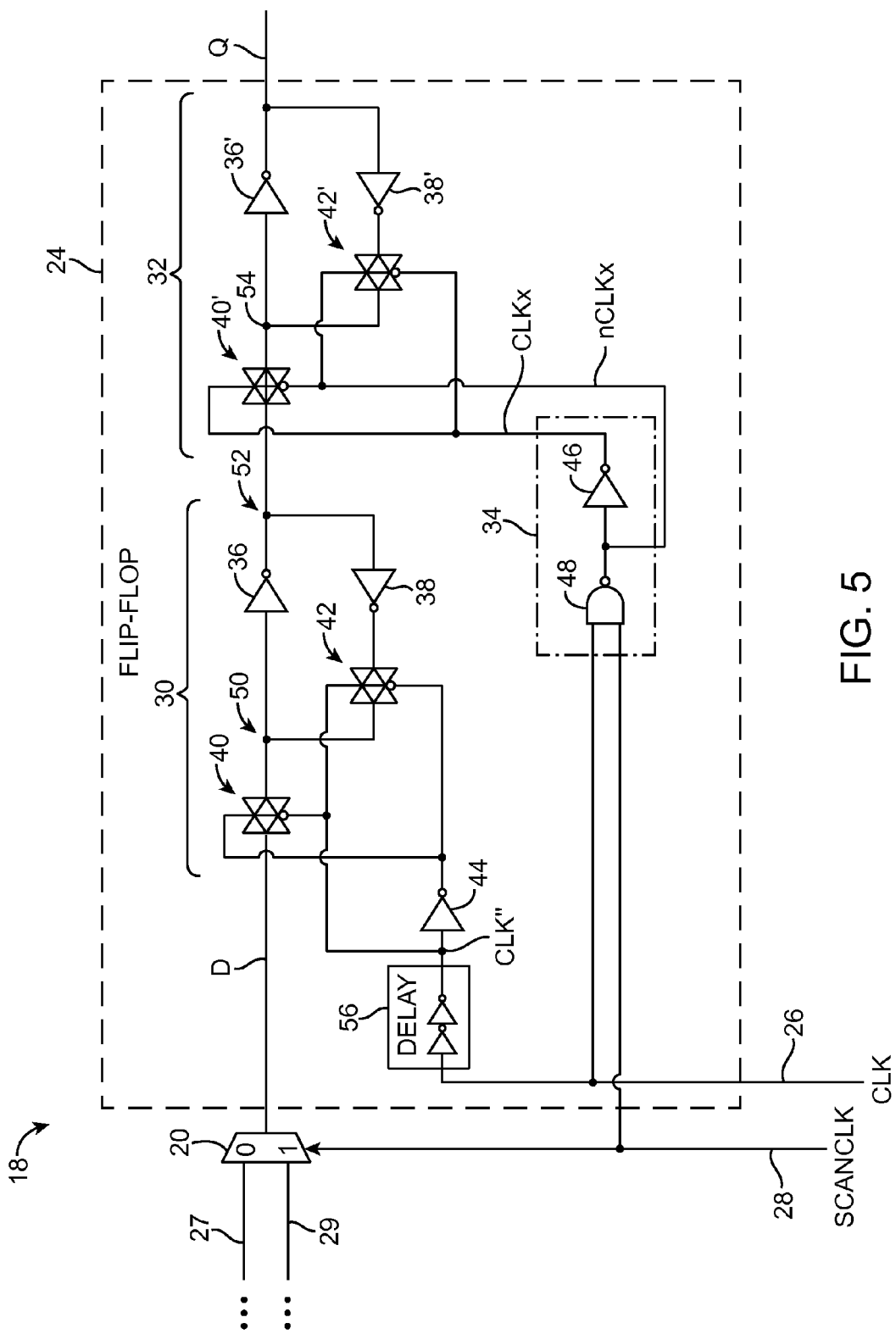
FIG. 5 is a circuit diagram of an illustrative flip-flop with an additional delay circuit in accordance with an embodiment of the present invention.

As shown in FIG. 5, a circuit such as delay circuit 56 may be formed as a part of flip-flop 24 to increase performance (e.g., by compensating for the delay of circuit 34). Delay circuit 56 may receive signal CLK over line 26 and may produce a delayed clock signal CLK" at its output. Signal CLK" may be fed to master latch 30 to control its transmission gates (e.g., gates 40 and 42). Delay circuit 56 may include two inverters connected in series. If desired, delay circuit 56 may include any even number of inverters or may include other suitable delay elements.

Delay circuit 56 may introduce a master latch clock delay that matches the slave latch clock delay. Delaying the clock signals in this way may effectively decrease a setup time (e.g., the amount of time data needs to be valid before the rising clock edge) to meet design criteria and effectively reduce a total propagation time (e.g., setup time plus clock-to-output delay) through the flip-flop. If desired, the master latch clock delay may be increased to a value greater than the slave latch delay to enable time borrowing (e.g., to allow a desired circuit design to be implemented without lowering clock speeds).

Figure 6:
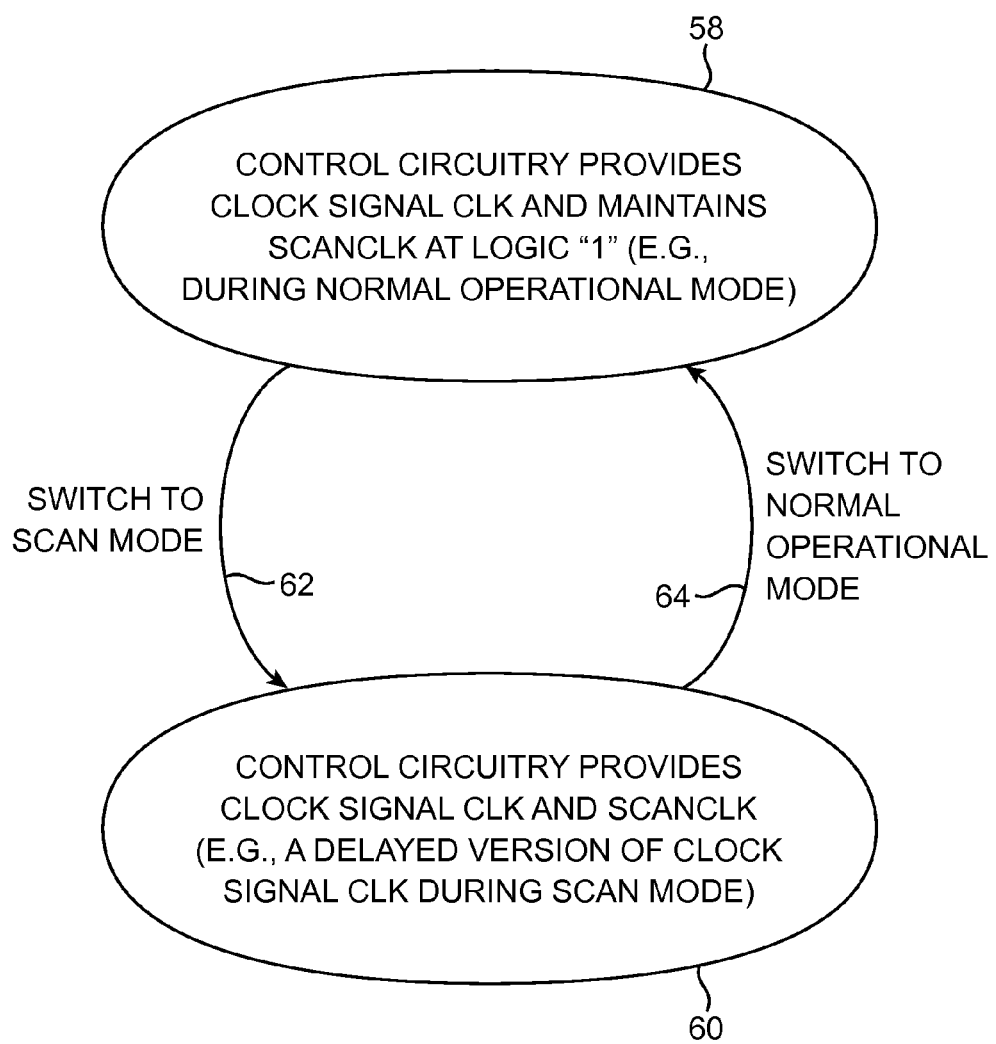
FIG. 6 is a diagram showing different operating modes for logic circuitry in accordance with an embodiment of the present invention.

FIG. 6 shows the different operating modes of integrated circuit 10. During normal operational mode, control circuitry 17 may generate a signal CLK that is a square wave and signal SCANCLK that is fixed at logic "1" (mode 58). In this situation, logic circuitry 12 (FIG. 1) may perform its intended functions. For example, if logic circuitry 12 is part of a programmable logic integrated circuit, logic circuitry 12 will operate normally in accordance with its programmed configuration.

If desired, logic circuitry 12 may be placed in scan mode (mode 60), as indicated by path 62. In scan (test) mode, control circuitry 17 may generate original clock signal CLK and delayed clock signal SCANCLK. Logic circuitry 12 that is provided with these control clock signals may operate as a scan chain. Following scan chain testing, circuit 10 may be switched back to normal operational mode, as indicated by path 64.

The foregoing is merely illustrative of the principles of this invention and various modifications can be made by those skilled in the art without departing from the scope and spirit of the invention.

What is claimed is:

1. Circuitry, comprising:
 first and second flip-flops operable as part of a scan chain in a scan mode and operable in a normal operational mode, wherein each of the first and second flip-flops comprises:
  a master level-sensitive latch having a master input that serves as an input for the first and second flip-flops and having a master output; and
  a slave level-sensitive latch having a slave input coupled to the master output and having a slave output that serves as an output for the first and second flip-flops; and
 control circuitry operable to generate first control signals for the master level-sensitive latch and the slave level-sensitive latch of the first and second flip-flops during the scan mode and operable to generate second control signals for the master level-sensitive latch and the slave level-sensitive latch of the first and second flip-flops during the normal operational mode, wherein the second control signals are different than the first control signals, wherein the first controls signals comprise a first clock signal and a second clock signal that is delayed version of the first clock signal, wherein the master level-sensitive latch of the first flip-flop is operable to receive the first clock signal at a first point in time, wherein the master level-sensitive latch of the second flip-flop is operable to receive the first clock signal at a second point in time that occurs a clock skew delay following the first point in time, wherein the slave level-sensitive latch of the first flip-flop is operable to receive the second clock signal that is delayed with respect to the first clock signal by a delay period that is greater than the clock skew delay.

2. The circuitry defined in claim 1, wherein the first and second flip-flops comprise two flip-flops in a plurality of flip-flops, the circuitry further comprising:
 a plurality of multiplexers, wherein each multiplexer in the plurality of multiplexers is interposed between a respective pair of flip-flops in the plurality of flip-flops.

3. The circuitry defined in claim 1, wherein the control circuitry is operable to output the first and second clock signals.

4. The circuitry defined in claim 3, wherein each of the first and second flip-flops further comprises:

a circuit interposed between the control circuitry and the slave level-sensitive latch, wherein the circuit has a first input operable to receive the first clock signal and a second input operable to receive the second clock signal during the scan mode.

5. The circuitry defined in claim 1, wherein each of the first and second flip-flops further comprises:
a circuit interposed between the control circuitry and the slave level-sensitive latch, wherein the second control signals comprise a third clock signal and a static control signal, wherein the control circuitry is configured to output the third clock signal and the static control signal, and wherein the circuit has a first input operable to receive the third clock signal and a second input operable to receive the static control signal during the normal operational mode.

6. A method of operating an integrated circuit having first and second flip-flop circuits operable as part of a scan chain in a scan mode and operable as part of a logic circuit during normal operational mode, wherein each of the first and second flip-flop circuits comprises first and second control inputs, the method comprising:
with control circuitry on the integrated circuit, providing a first clock signal to the first and second flip-flop circuits during the scan mode, wherein the first control input of the first flip-flop is operable to receive the first clock signal at a first time instance, wherein the first control input of the second flip-flop is operable to receive the first clock signal at a second time instance that is delayed with respect to the first time instance by a clock skew delay;
with the control circuitry, providing a second clock signal to the first and second flip-flop circuits during the scan mode, wherein the second control input of the first flip-flop is operable to receive the second clock signal that is delayed with respect to the first clock signal by a predetermined delay period that is greater than the clock skew delay;
with the control circuitry, providing the first clock signal to the first control input of the first and second flip-flop circuits during the normal operational mode; and
with the control circuitry, providing a static control signal to the second control input of the first and second flip-flop circuits during the normal operational mode.

7. The method defined in claim 6, wherein the predetermined delay period is less than a half clock period of the first clock signal.

8. The method defined in claim 7, wherein the integrated circuit further includes a multiplexer that has a control input, the method further comprising:
with the control circuitry, providing the second clock signal to the control input of the multiplexer during the scan mode; and
with the control circuitry, providing the static control signal to the control input of the multiplexer during the normal operational mode.

9. The method defined in claim 6, wherein the integrated circuit further includes a multiplexer that has a control input, the method further comprising:
with the control circuitry, providing the second clock signal to the control input of the multiplexer during the scan mode; and
with the control circuitry, providing the static control signal to the control input of the multiplexer during the normal operational mode.

10. An integrated circuit, comprising:
a flip-flop circuit that includes a master latch, a slave latch, and a delay circuit, wherein the master latch is controlled by first and second control signals, wherein the slave latch is controlled by third and fourth control signals that are different than the first and second control signals, wherein the delay circuit is operable to delay a portion of the first control signals by a predetermined amount of time prior to applying the first control signals to the master latch, wherein the slave latch comprises a slave level-sensitive latch and wherein the first and third control signals comprise first and third clock signals that are delayed with respect to each other by less than a half clock cycle.

11. The integrated circuit defined in claim 10, wherein the master latch comprises a master level-sensitive latch.

12. The integrated circuit defined in claim 10, wherein the first clock signal has a given frequency, wherein the second control signal comprises a second clock signal having the given frequency, wherein the third clock signal has the given frequency, wherein the fourth control signal comprises a fourth clock signal having the given frequency, wherein the second clock signal is an inverted version of the first clock signal, and wherein the fourth clock signal is an inverted version of the third clock signal.

13. Circuitry operable in first and second modes, comprising:
a flip-flop that includes a master level-sensitive latch and a slave level-sensitive latch coupled in series; and
control circuitry that generates first and second control signals, wherein the slave level-sensitive latch receives the first and second control signals via a logic gate, wherein the logic gate has a first input that receives the first control signal and a second input that receives the second control signal, wherein the master level-sensitive latch receives a delayed version of the first control signal via a delay circuit, wherein the second control signal is a static control signal having a fixed signal level during the first mode, and wherein the second control signal is a delayed with respect to the first control signal during the second mode.

14. The circuitry defined in claim 13, wherein the second control signal is delayed with respect to the first control signal by less than a half clock cycle during the second mode.

* * * * *